(12) United States Patent
Matsushima et al.

(10) Patent No.: US 6,515,360 B2
(45) Date of Patent: *Feb. 4, 2003

(54) PACKAGED SEMICONDUCTOR DEVICE AND MANUFACTURING METHOD THEREOF

(75) Inventors: Hironori Matsushima, Tokyo (JP); Yoshihiro Tomita, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 58 days.

(21) Appl. No.: 09/495,906

(22) Filed: Feb. 2, 2000

(65) Prior Publication Data

US 2001/0040288 A1 Nov. 15, 2001

(30) Foreign Application Priority Data

Jul. 28, 1999 (JP) ............................................ 11-214363

(51) Int. Cl.⁷ .............................................. H01L 23/12
(52) U.S. Cl. ........................ 257/704; 257/706; 257/707; 257/780; 257/713; 257/778; 257/738; 438/12
(58) Field of Search ................................ 257/704–707, 257/738, 780, 778, 713; 361/704

(56) References Cited

U.S. PATENT DOCUMENTS

| | | | | |
|---|---|---|---|---|
| 5,313,099 A | * | 5/1994 | Tata et al. | 257/717 |
| 5,353,193 A | * | 10/1994 | Chia et al. | 361/704 |
| 5,789,813 A | * | 8/1998 | Kirkland et al. | 257/712 |
| 5,821,161 A | * | 10/1998 | Covell, II et al. | 438/613 |
| 5,909,056 A | * | 6/1999 | Mertol | 257/704 |
| 6,011,304 A | * | 1/2000 | Mertol | 257/706 |
| 6,165,612 A | * | 12/2000 | Misra | 428/344 |
| 6,166,434 A | * | 12/2000 | Desai et al. | 257/704 |
| 6,172,878 B1 | * | 1/2001 | Takabayashi et al. | 361/760 |

FOREIGN PATENT DOCUMENTS

JP          7-142532         6/1995

* cited by examiner

*Primary Examiner*—Tom Thomas
*Assistant Examiner*—Nitin Parekh
(74) *Attorney, Agent, or Firm*—McDermott, Will & Emery

(57) ABSTRACT

A semiconductor chip is attached on a package substrate so as to be electrically connected to it and sealed. A ring member is attached to the package substrate and surrounds the semiconductor chip. A lid member is attached to the ring member and covers the semiconductor chip. The lid member is formed so as to be able to be removed from the ring member without impairing the attachment of the ring member to the package substrate.

6 Claims, 4 Drawing Sheets

PACKAGED SEMICONDUCTOR DEVICE AND MANUFACTURING METHOD THEREOF

BACKGROUND OF THE INVENTION

1. Field of the Invention

The present invention relates to a semiconductor device having a package structure in which a semiconductor element is accommodated.

2. Background Art

There are known semiconductor devices which assume a package structure in which a semiconductor chip is accommodated on a package substrate made of an organic material or ceramics by a flip-chip method, die bonding method, or TAB (tape attached bonding) method, and in which the semiconductor chip is sealed by a lid made of a metal or a resin, or sealed by a two-layer structure of a heat spreader and a ring, or only by a ring provided on the package substrate.

FIG. 4 is a sectional view showing an example of such conventional semiconductor devices. In this conventional semiconductor device, a semiconductor chip 5 is, for example, flip-chip-connected to a package substrate 6 and sealed with a sealing agent 6a. And, a ring 2 and a lid 1 are laminated and bonded to the package substrate 6 with an adhesive 4 to accommodate the semiconductor chip 5 inside and protect it. The top of the semiconductor chip 5 is connected to the lid 1 with an adhesive 5a.

FIG. 5 is a sectional view showing another example of the conventional semiconductor devices. This example does not have any member corresponding to the ring 2 shown in FIG. 4. A peripheral portion of a flat-plate portion 1a of a lid 1 extends downward to form a leg portion 1b, and the bottom face of the leg portion 1b is fixed to a package substrate 6 with an adhesive 4. The top of a semiconductor chip 5 is connected to the lid 1 with an adhesive 5a.

FIG. 6 is a sectional view showing a further example of the conventional semiconductor devices. This example does not have any member corresponding to the lid 1 shown in FIG. 4.

Where a semiconductor device is mounted on a mounting circuit board and an enhanced heat dissipation effect is obtained by attaching radiation fins, it is advantageous in terms of heat dissipation to directly attach radiation fins to the semiconductor chip. However, in the conventional semiconductor device shown in FIGS. 4 and 5 in which the semiconductor chip is sealed by the lid or heat spreader, it is impossible to directly attach radiation fins to the semiconductor chip and it is difficult to remove the lid or heat spreader before attaching radiation fins to the semiconductor chip.

In case of the two-layer structure of the lid (or heat spreader) 1 and the ring 2, the adhesive 4 is of an epoxy resin type material, for example, and the two-layer structure can be removed, that is, peeled off, by heating the adhesive 4 to a high temperature (150° C.). However, it is difficult to do so.

Therefore, usually, radiation fins are attached to the lid (or heat spreader) 1.

Furthermore, the semiconductor device having no lid shown in FIG. 6 has a problem of difficulty in handling: the semiconductor chip may be damaged in such handling as picking-up at the time of a test or in mounting it on a mounting circuit board.

SUMMARY OF THE INVENTION

The present invention has been made to solve the above problems in the art, and an object of the invention is therefore to provide a semiconductor device having a package structure that can be handled more properly when, for example, mounted on the mounting circuit board and that is improved in heat dissipation performance.

According to one aspect of the present invention, a semiconductor device comprises a package substrate and a semiconductor chip attached to the package substrate so as to be electrically connected to the package substrate and sealed. A ring member is attached to the package substrate surrounding the semiconductor chip. Further, a lid member is attached to the ring member to cover the semiconductor chip, and the lid member is provided so as to be able to be removed from the ring member without impairing attachment of the ring member to the package substrate.

In another aspect, in the semiconductor device, the ring member may be bonded to the package substrate with a first adhesive and the lid member may be bonded to the ring member with a second adhesive, and reduction in adhesion of the second adhesive is greater than that of the first adhesive at the time of heating.

In another aspect, in the semiconductor device, the ring member may have a groove along the inner side thereof at a position higher than a top surface of the semiconductor chip and is open on one side, and the lid member may be fitted into the groove of the ring member.

In another aspect, in the semiconductor device, the lid member may have a cap shape so as to engage with the ring member, and the lid member may be removed from the ring member through thermal expansion when heated.

Other and further objects, features and advantages of the invention will appear more fully from the following description.

DETAILED DESCRIPTION OF THE PREFERRED EMBODIMENTS

First Embodiment

FIGS. 1A–1G are sectional views showing a structure, a manufacturing method, and functions of a semiconductor device according to a first embodiment of the present invention.

First, the manufacturing method of this semiconductor device will be described with reference to FIGS. 1A–1E.

Figure 1A:
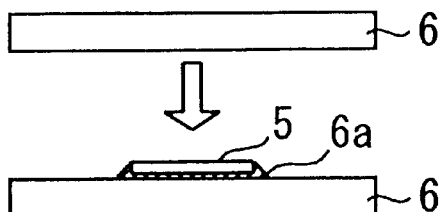
FIGS. 1A–1G are sectional views showing a structure, a manufacturing method, and functions of a packaged semiconductor device according to a first embodiment of the present invention.

First, a package substrate 6 is prepared as shown in FIG. 1A.

Figure 1B:
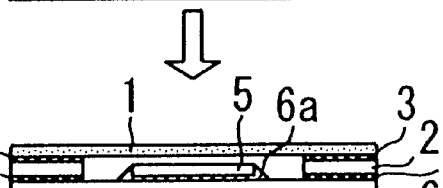

Then, as shown in FIG. 1B, a semiconductor chip 5 is mounted on the package substrate 6 by a flip-chip method, for example, and sealed with a sealing agent 6a.

Figure 1C:
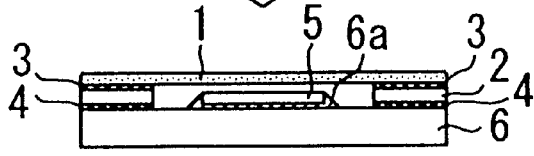

Then, as shown in FIG. 1C, a ring 2 (ring member) is fixed to the package substrate 6 with an adhesive 4 (first adhesive). Further, a lid (or heat spreader) 1 (lid member) is attached to the ring 2 by using an adhesive 3 (second adhesive), whereby a cavity structure for protecting the semiconductor chip 5 is formed.

For example, the ring 2 is a rectangular annular member and is made of a metal such as Cu, Al, 42 Alloy, etc., plastics, or the like. The thickness of the ring 2 is set approximately the same as or somewhat greater than that of the semiconductor chip 5.

The lid 1, which is a flat-plate-like member, is attached to prevent the semiconductor chip 5 from being damaged during handling etc. The lid 1 is made of a metal such as Cu, Al, 42 Alloy etc., plastics, or the like. The thickness of the lid 1 is set at 0.1–1 mm and its size is approximately the same as that of the package substrate 6.

The adhesive 4 is a thermosetting or thermoplastic tape or resin, and has a thickness of about 0.01–0.1 mm. The adhesive 3 is a thermoplastic tape or resin, for example, and has a thickness of about 0.01–0.1 mm.

Figure 1D:
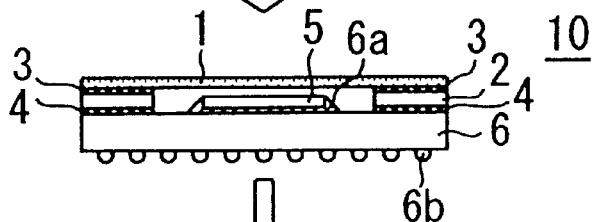

Then, as shown in FIG. 1D, external electrodes 6b(external terminals) such as solder balls or pins are attached to the bottom surface of the package substrate 6. A semiconductor device 10 of this embodiment is formed in this manner.

Next, the mounting method and the functions of the semiconductor device 10 will be described with reference to FIGS. 1E–1G.

Figure 1E:
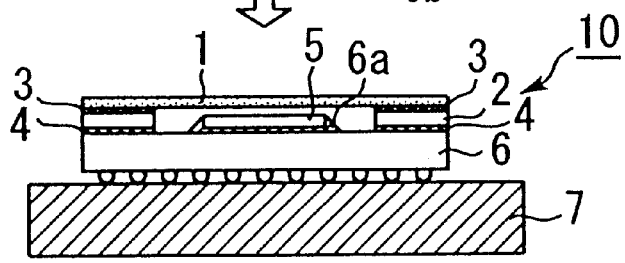

FIG. 1E is a sectional view showing a structure in a state that the semiconductor device 10 is mounted on a mounting circuit board 7. As shown in FIG. 1E, the external electrodes 6 on the bottom surface of the package substrate 6 of the semiconductor device 10 are electrically connected to and fixed to electrodes (not shown) on the front surface of the mounting circuit board 7.

Figure 1F:
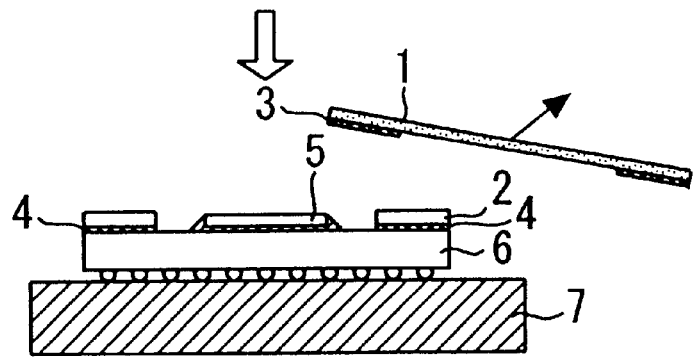

FIG. 1F is a sectional view showing a structure in a state that the lid 1 of the semiconductor device 10 is removed after the semiconductor device 10 was mounted on the mounting circuit board 7. The method for removing the lid 1 will be described later.

Figure 1G:
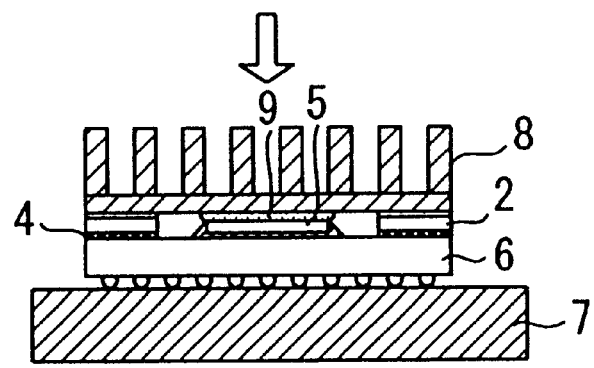

FIG. 1G is a sectional view showing a structure in a state that a radiation fin member 8 is attached to the semiconductor device 10 from which the lid 1 is removed.

There are no limitations on the shape and the material of the radiation fin member 8.

There are no limitations on the method for fixing the radiation fin member 8. In one example of fixing methods, the radiation fin member 8 is attached with a heat-conductive resin and then cured after the semiconductor device 10 is mounted on the mounting circuit board 7. In another example, the radiation fin member 8 is bonded via an adhesive sheet.

Since the radiation fin member 8 is connected to the semiconductor chip 5 directly or via a thin, highly heat-conductive adhesive 9, sufficient heat dissipation occurs from the semiconductor chip 6.

The radiation fin member 8 is stable because both its ends are fixed to the ring 2. Further, the radiation fin member 8 can prevent exertion of excessive pressure on the semiconductor chip 5 because both its ends are fixed to the ring 2.

In the semiconductor device having the above configuration according to this embodiment, by virtue of its superior handing-related performance, the semiconductor device can be mounted on a mounting circuit board without damaging the semiconductor chip. After it is mounted on the mounting circuit board, a radiation fin member can directly be attached to the semiconductor chip by removing the lid or heat spreader. Therefore, the semiconductor device exhibits improved heat dissipation performance.

Second Embodiment

A semiconductor device according to a second embodiment of the present invention will be described with reference to FIG. 1D.

According to the second embodiment, in the semiconductor device in which the semiconductor chip 5 placed on the package substrate 6 is sealed by the two-layer structure of the ring 2 and the lid (or heat spreader) 1, the adhesive 3 for bonding the lid (or heat spreader) 1 to the ring 2 is made of a different material than the adhesive 4 for bonding the ring 2 to the package substrate 6, and the adhesive 3 is made of a material that can easily be peeled off by heating. An example of the material that can easily be peeled off by heating is a thermoplastic tape material.

With the above structure, the lid (or heat spreader) 1 can easily be removed by increasing the temperature to 100° C. or an even lower temperature. For example, the thermoplastic tape material is used as the material.

For example, the lid (or heat spreader) 1 can easily be removed after the semiconductor device 10 was subjected to reflow to be mounted on a mounting circuit board and prior to be cooled.

As described above, in the semiconductor device according to this embodiment, the handling-related performance is improved, the lid can be removed easily, and the heat dissipation performance can be improved.

Third Embodiment

Figure 2A:
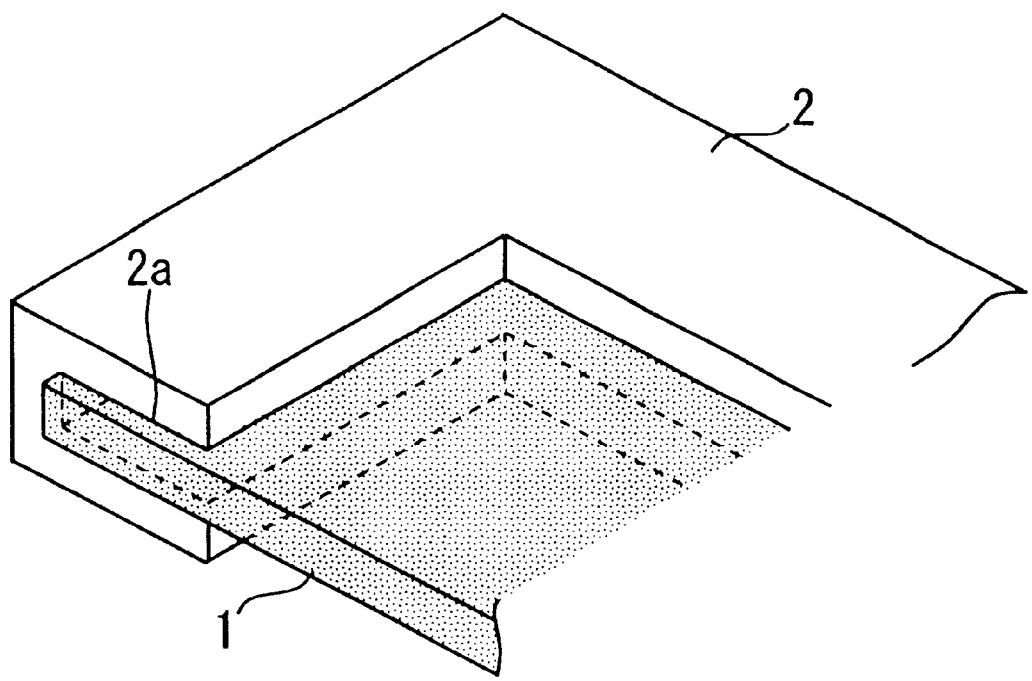
FIG. 2A is a perspective view of a lid and a ring member in a packaged semiconductor device according to a third embodiment of the invention.
Figure 2B:
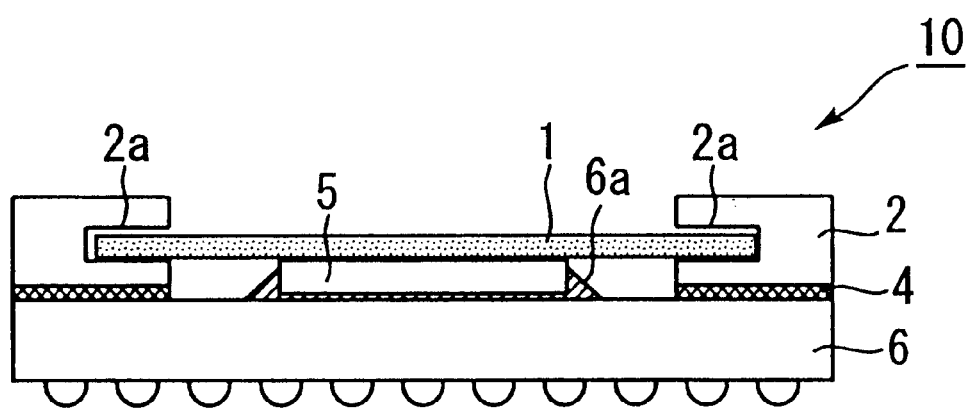
FIG. 2B is a sectional view showing the structure of the packaged semiconductor device according to the third embodiment of the invention.

FIGS. 2A and 2B show a semiconductor device according to a third embodiment of the invention. FIG. 2A is a perspective view of a lid and a ring member, and FIG. 2B is a sectional view showing the structure of the semiconductor device.

In this embodiment, as shown in FIG. 2A, a groove 21 a parallel with the surfaces of the ring member 2 is cut in the ring member 2 at a middle position in the thickness direction. The groove 2a is opened in one side surface of the ring member 2 so that the lid (or heat spreader) 1 can be slid and fitted into the ring member 2 from the opening of the groove 2a. The groove 2a is formed at such a position that the lid 1 does not contact a semiconductor chip 5 when fitted into the ring member 2.

FIG. 2B is a sectional view in a state that a semiconductor device 10 is constructed by bonding the ring member 2 to a package substrate 6 with an adhesive 4 and inserting the lid 1 into the groove 2a. Preliminarily, the semiconductor chip 5 is, for example, flip-chip-connected to the package substrate 6 and sealed and fixed with a sealing agent 6a.

According to this embodiment, the lid (or heat spreader) 1 can easily be removed before a radiation fin member 8 as shown in FIG. 1G is attached.

As described above, in the semiconductor device according to this embodiment, the handling-related performance is improved, the lid can be removed easily, and the heat dissipation performance can be improved.

Fourth Embodiment

Figure 3A:
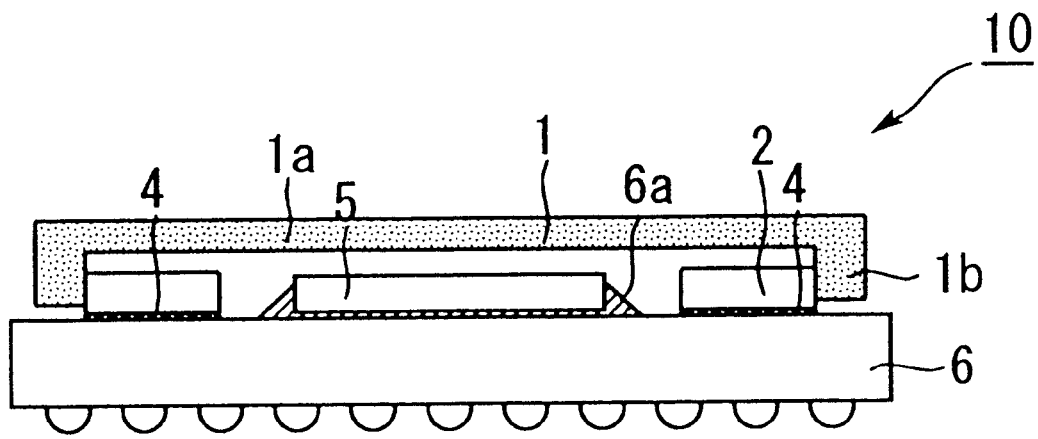
FIG. 3A is a sectional view of a packaged semiconductor device at ordinary temperature according to a fourth embodiment of the present invention.
Figure 3B:
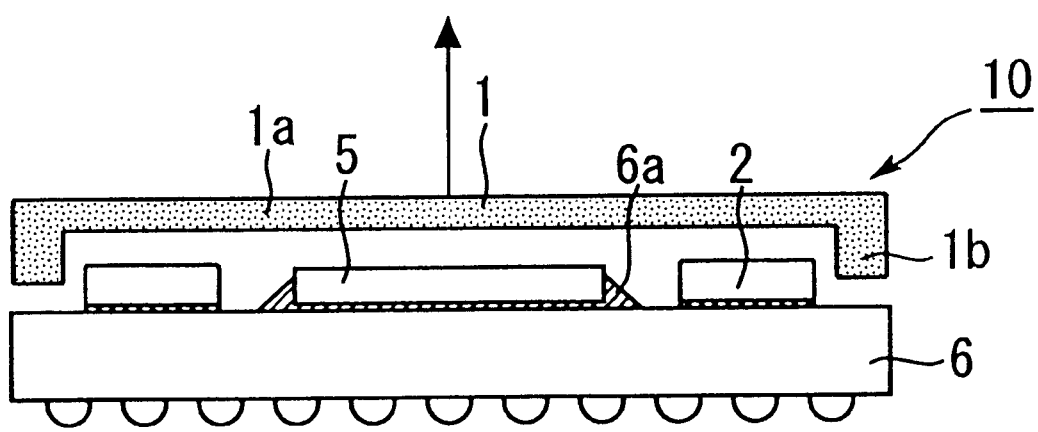
FIG. 3B is a sectional view showing the packaged semiconductor device in a heated state according to the fourth embodiment of the present invention.
Figure 4:
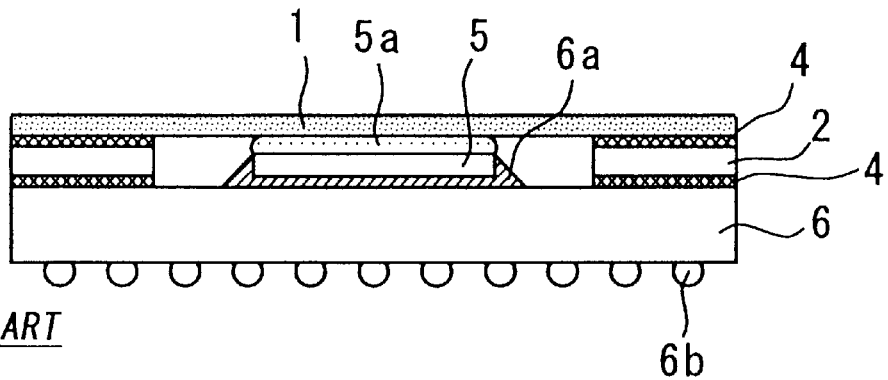
FIG. 4 is a sectional view showing an example of a conventional packaged semiconductor device.
Figure 5:
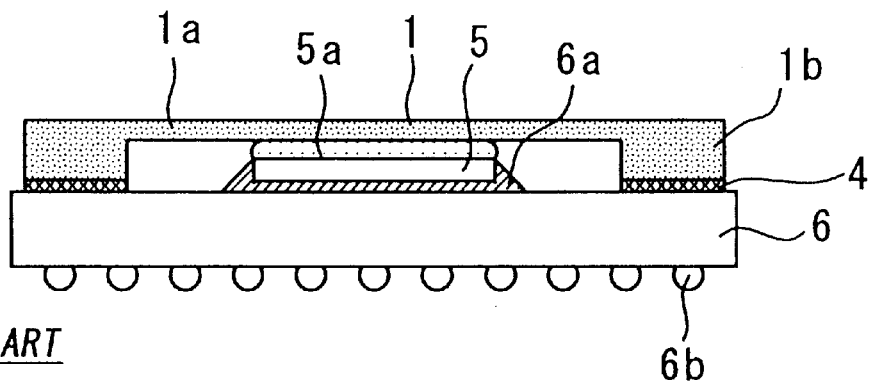
FIG. 5 is a sectional view showing another example of a conventional packaged semiconductor device.
Figure 6:
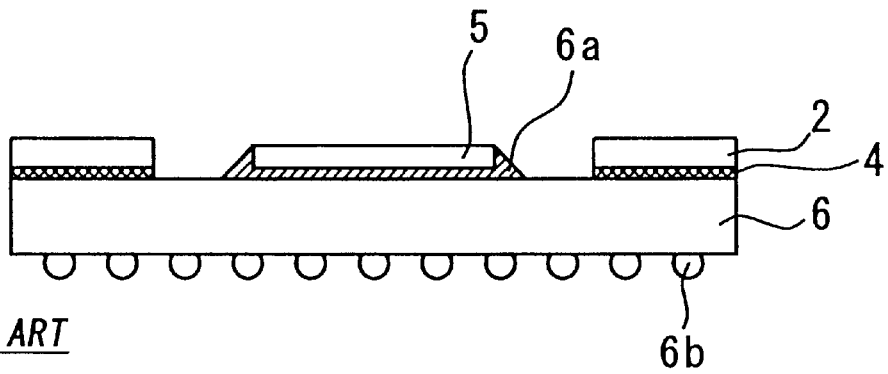
FIG. 6 is a sectional view showing a further example of a conventional packaged semiconductor device.

FIGS. 3A and 3B show a semiconductor device according to a fourth embodiment of the present invention. FIG. 3A is a sectional view of the semiconductor device at ordinary temperature, and FIG. 3B is a sectional view showing the semiconductor device in a heated state.

As shown in FIGS. 3A and 3B, in the semiconductor device 10 of this embodiment, a semiconductor chip 5 is, for example, flip-chip-connected to a package substrate 6 and sealed and fixed with a sealing agent 6a. A ring 2 is bonded to the package substrate 6 with an adhesive 4. A lid 1 in the fourth embodiment has a cap-like or box-like shape in which a leg portion 1b extends from a peripheral portion of a flat-plate portion 1a.

Next, a method of mounting the lid 1 will be described.

First, as shown in FIG. 3B, the lid 1 is expanded by heating. The expanded lid 1 is put on the outside of the ring 2 on the package substrate 6.

When the temperature of the lid 1 returns to ordinary temperature, its inner diameter decreases and the lid 1 fits to the ring 2 as shown in FIG. 3A.

Conversely, if the semiconductor device 10 in the state of FIG. 3A is heated, the lid 1 expands as shown in FIG. 3B and the lid 1 can easily be removed because of a difference in thermal expansion between the lid 1 and the ring 2.

In this manner, the lid 1 can be fitted with the ring 2 at ordinary temperature as shown in FIG. 3A by setting the thermal expansion coefficient of the material of the lid 1 larger than that of the material of the ring 2 and putting the temperature-increased lid 1 on the ring 2 from outside.

For example, a Cu-type alloy having a thermal expansion coefficient α of 17 ppm/K can be used as a material of the ring 2. On the other hand, a resin having a thermal expansion coefficient α of 50 ppm/K or more can be used as a material of the lid 1.

As exemplified above, the lid 1 can be removed by increasing the temperature by 50 –100° C. if the thermal expansion coefficients of the materials of the lid 1 and the ring 2 have a difference of 20 ppm/K or more.

According to this embodiment, the lid (or heat spreader) 1 can easily be removed before a radiation fin member 8 as shown in FIG. 1G is attached.

As described above, in the semiconductor device according to this embodiment, the handling-related performance is improved, the lid can be removed easily, and the heat dissipation performance can be improved.

In the semiconductor device having the above configuration according to the present invention, the semiconductor chip is not damaged by virtue of its superior handing-related performance before the semiconductor device is mounted on a mounting circuit board. After the semiconductor device is mounted on a circuit board, a radiation fin member can directly be attached to the semiconductor chip by removing the lid or heat spreader. Therefore, the semiconductor device exhibits improved heat dissipation performance.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-214363, filed on Jul. 28, 1999 including specification, claims, drawings and summary, on which the Convention priority of the present application is based, are incorporated herein by reference in its entirety.

In the claims:

1. A semiconductor device comprising:

a package substrate;

a semiconductor chip attached to said package substrate so as to be electrically connected to said package substrate;

a ring member that is attached to said package substrate surrounding said semiconductor chip in a cavity thereof; and a lid member that is attached to said ring member to seal said cavity, said lid member being formed so as to be able to be removed from said ring member to allow direct contact to said semiconductor chip without impairing attachment of said ring member to said package substrate, wherein said ring member is bonded to said package substrate with a first adhesive and said lid member is bonded to said ring member with a second adhesive, and wherein said first adhesive is a thermosetting resin and said second adhesive is a thermoplastic resin.

2. The semiconductor device according to claim 1, wherein reduction in adhesion of said second adhesive is greater than that of said first adhesive at the time of heating.

3. The semiconductor device according to claim 2, wherein said first adhesive prevents removal of said ring member up to a temperature of 100° C., and said second adhesive allows removal of said lid member below a temperature of 100° C.

4. The semiconductor device according to claim 1, wherein said lid member has a cap shape so as to engage said ring member, and wherein said lid member can be removed from said ring member through thermal expansion when heated.

5. A method of mounting a semiconductor device on a circuit board, comprising the steps of:

mounting the semiconductor device according to claim 1 on a mounting circuit board; and removing the lid member of the semiconductor device.

6. A semiconductor device comprising:

a package substrate;

a semiconductor chip attached to said package substrate so as to be electrically connected to said package substrate;

a ring member that is attached to said package substrate surrounding said semiconductor chip in a cavity thereof; and a lid member that is attached to said ring member to seal said cavity, said lid member being formed so as to be able to be removed from said ring member to allow direct contact to said semiconductor chip without impairing attachment of said ring member to said package substrate, wherein said ring member has a groove along the inner side thereof at a position higher than a top surface of said semiconductor chip and has an opening on one side surface, and wherein said lid member is fitted into said groove of said ring member from said side surface opening.

* * * * *